(12) United States Patent
Kamiyama et al.

(10) Patent No.: US 7,833,807 B2
(45) Date of Patent: Nov. 16, 2010

(54) METHOD OF MANUFACTURING SEMICONDUCTOR LASER FOR COMMUNICATION, SEMICONDUCTOR LASER FOR COMMUNICATION AND OPTICAL TRANSMISSION MODULE

(75) Inventors: Hiroyuki Kamiyama, Saitama (JP); Masaru Mukaikubo, Fujisawa (JP); Hiroaki Inoue, Hidaka (JP); Chiyuki Kitahara, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 370 days.

(21) Appl. No.: 11/882,595

(22) Filed: Aug. 2, 2007

(65) Prior Publication Data

US 2008/0089378 A1 Apr. 17, 2008

(30) Foreign Application Priority Data

Aug. 22, 2006 (JP) ............................. 2006-225153

(51) Int. Cl.
*H01L 21/66* (2006.01)
(52) U.S. Cl. .................... 438/16; 438/47; 257/E21.527
(58) Field of Classification Search ........... 257/E21.527
See application file for complete search history.

(56) References Cited

U.S. PATENT DOCUMENTS

| 4,573,255 | A | 3/1986 | Gordon et al. |
| 5,530,713 | A | 6/1996 | Fukagai |
| 6,249,140 | B1 | 6/2001 | Shigihara |
| 2002/0154664 | A1 * | 10/2002 | Okubo ......................... 372/45 |

FOREIGN PATENT DOCUMENTS

| EP | 1195864 A2 * | 4/2002 |
| JP | 7-79051 | 3/1995 |
| JP | 10-303496 | 11/1998 |
| JP | 2002-289977 | 10/2002 |

OTHER PUBLICATIONS

Paoletti, R., et al., "Highly reliable and high yield 1300 nm InGaAlAs directly modulated ridge Fabry-Perot lasers, operating at 10Gb/s, up to 110° C, with constant current swing.", PDP15, OFC 2005.
European Search Report issued in European Patent Application No. EP 07 01 4544 dated Sep. 9, 2009.
Korean Office Action issued in Korean Patent Application No. 10-2007-0077883. dated Nov. 29, 2008.

* cited by examiner

*Primary Examiner*—Stephen W Smoot
(74) *Attorney, Agent, or Firm*—McDermott Will & Emery LLP

(57) ABSTRACT

Some semiconductor lasers have an initial failure mode that is advanced as the amount of optical power therein, namely, the amount of optical output observed from the outside increases in almost independent of the temperature. The initial failure mode that is advanced as the amount of optical output increases is not sufficiently screened, so that the initial failure rate is somewhat higher than that of the semiconductor laser having the conventional active layer material. It is effective to introduce a test with large optical output at lower temperature than average operating temperature such as room temperature, during the manufacturing process. This helps to eliminate elements having the initial failure mode that is advanced as the amount optical output increases, thereby to extend the expected life of the laser diodes.

8 Claims, 6 Drawing Sheets

ELECTRON

HOLE

ELECTRON

HOLE

METHOD OF MANUFACTURING SEMICONDUCTOR LASER FOR COMMUNICATION, SEMICONDUCTOR LASER FOR COMMUNICATION AND OPTICAL TRANSMISSION MODULE

CLAIM OF PRIORITY

The present application claims priority from Japanese patent application serial no. 2006-225153, filed on Aug. 22, 2006, the content of which is hereby incorporated by reference into this application.

BACKGROUND OF THE INVENTION

The present invention relates to a method of manufacturing a semiconductor laser for communication, a semiconductor laser for communication and an optical transmission module, and more particularly to a method of manufacturing a semiconductor laser for communication with excellent reliability, a semiconductor laser for communication and an optical transmission module.

As represented by a bathtub curve shown in FIG. 1, the failure mode of a product is generally classified into three types, namely an initial failure, a random failure, and a wear-out failure. The meaning of performing a screening test is to remove initial failure products of a semiconductor laser in short times, and to input products in a state of having a sufficiently long expected life into the market.

As the screening test for eliminating initial failure products of a semiconductor laser for optical communication, it is generally used a test of high temperature and large current, which is performed under conditions of 60° C. to 150° C. and 100 mA to 200 mA. An example of such a screening test is described in JP-A No. Hei 10 (1998)-303496.

In R. Paoletti et al., "Highly reliable and high yield 1300 nm InGaAlAs directly modulated ridge Fabry-Perot lasers, operating at 100 Gb/s, up to 110° C. with constant current swing", PDP 15, OFC 2005, there are described InGaAlAs directly modulated lasers of Fabry-Perot structure operating at up to high temperatures.

SUMMARY OF THE INVENTION

The material InGaAlAs for active layers, which is described in Paoletti et al., has a short history as a communication laser. Further there has been known that InGaAlAs has more crystal defects than InGaAsP. In addition, the failure mode of communication lasers using active materials with relatively many crystal defects has not been perfectly explained. For this reason, no thorough study has been done on the screening test conditions included in the manufacturing process of InGaAlAs lasers. The present invention aims to establish screening conditions of the communication laser in which a composition with relatively many crystal defects is used for the active material composition, and to provide a highly reliable communication laser. Known examples of the composition with more crystal defects than InGaAsP, are AlGaAs, GaInNAs and other materials, in addition to InGaAlAs.

The above is achieved by a method of manufacturing a semiconductor laser for communication including a screening step of constant operating current with an optical output of not less than 15 mW at the initial optical output, or of constant optical output with an optical output of not less than 15 mW. Alternatively it is achieved by a method of manufacturing semiconductor laser for communication including a screening step of constant operating current with an optical output of not less than 50% of the saturation optical output at the initial optical output, or of constant optical output with an optical output of not less than 50% of the saturation optical output.

Further, the above is achieved by a semiconductor laser for communication manufactured through a screening step of constant operating current with an optical output of not less than 15 mW at the initial optical output, or of constant optical output with an optical output of not less than 15 mW. Alternatively it is achieved by a semiconductor laser for communication manufactured through a screening step of constant operating current with an optical output of not less than 50% of the saturation optical output at the initial optical output, or of constant optical output with an optical output of not less than 50% of the saturation optical output.

Still further, the above is achieved by an optical transmission module provided in a case with a semiconductor laser for communication, a driver for driving the communication laser, and a photodiode for monitoring the output of the semiconductor laser for communication, in which the semiconductor laser for communication is manufactured through a screening step of constant operating current with an optical output of not less than 15 mW at the initial optical output, or of constant optical output with an optical output of not less than 15 mW. Alternatively it is achieved by an optical transmission module provided in a case with a semiconductor laser for communication, a driver for driving the communication laser, and a photodiode for monitoring the output of the semiconductor laser for communication, in which the semiconductor laser for communication is manufactured through a screening step of constant operating current with an optical output of not less than 50% of the saturation optical output at the initial optical output, or of constant optical output with an optical output of not less than 50% of the saturation optical output.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
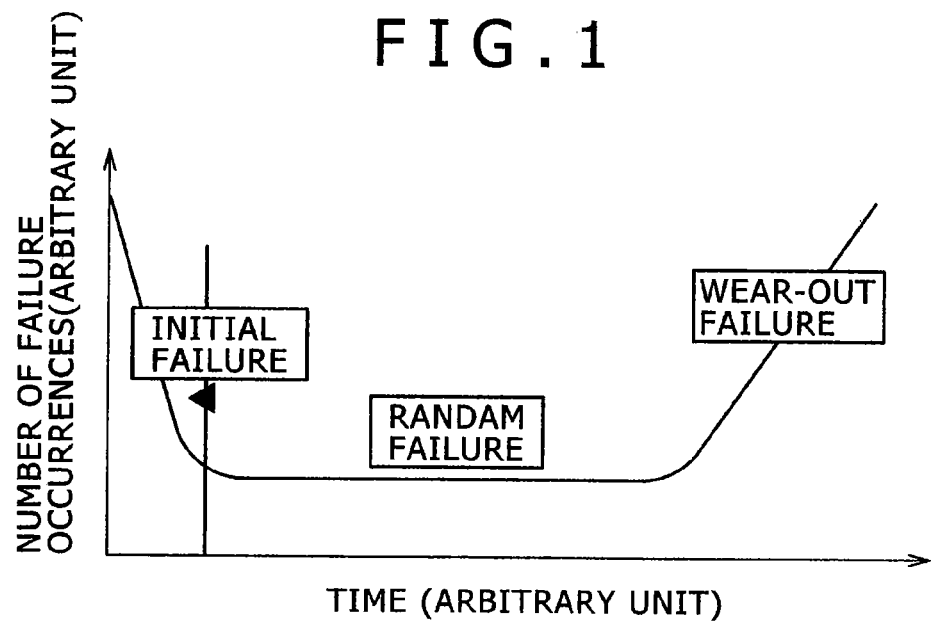
FIG. 1 is a view illustrating the relation between the number of failure occurrences and the current carrying time of products.

Hereinafter modes for carrying out the present invention will be described using embodiments with reference to the accompanying drawings. Like parts are given like reference numerals and their description will not be repeated. Also hatching of cross section is omitted from the figures including cross sections so as to avoid complexity.

Embodiment 1

Figure 2A:
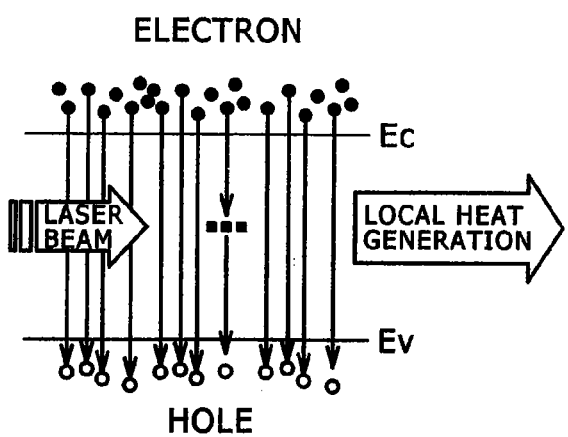
FIG. 2 is a view illustrating an initial failure mode due to the amount of optical output.
Figure 2B:
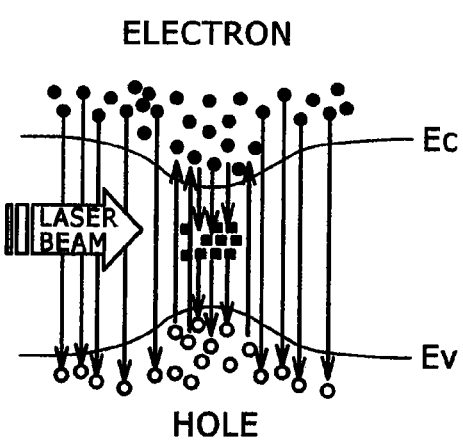
Figure 3:
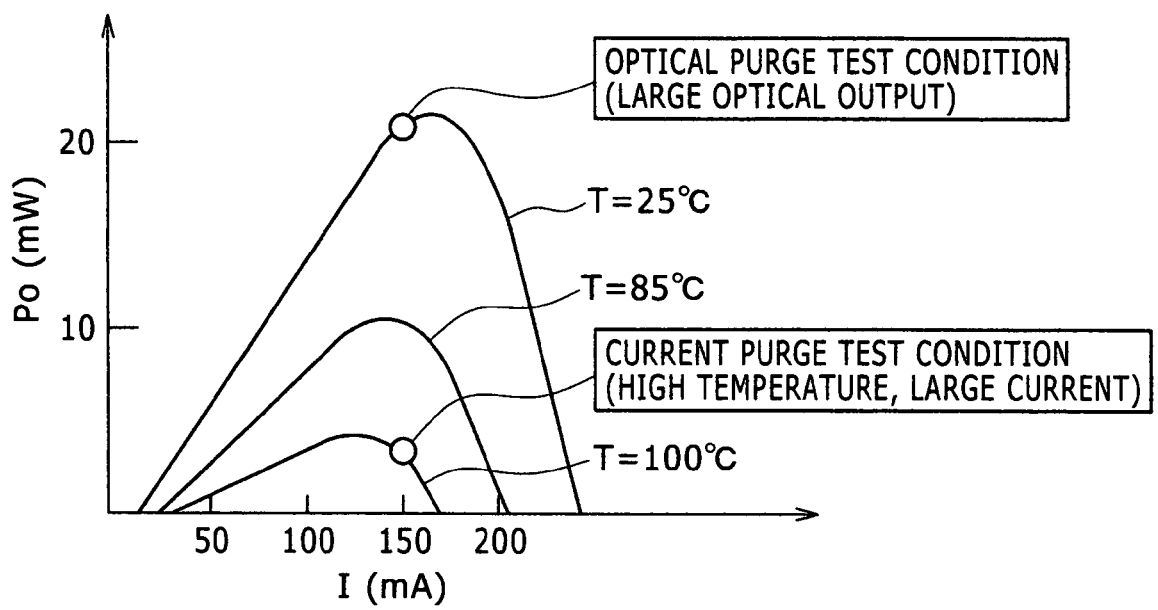
FIG. 3 is a view illustrating the relation of the input power and the optical output (I-L characteristic) with temperature as a parameter.
Figure 4:
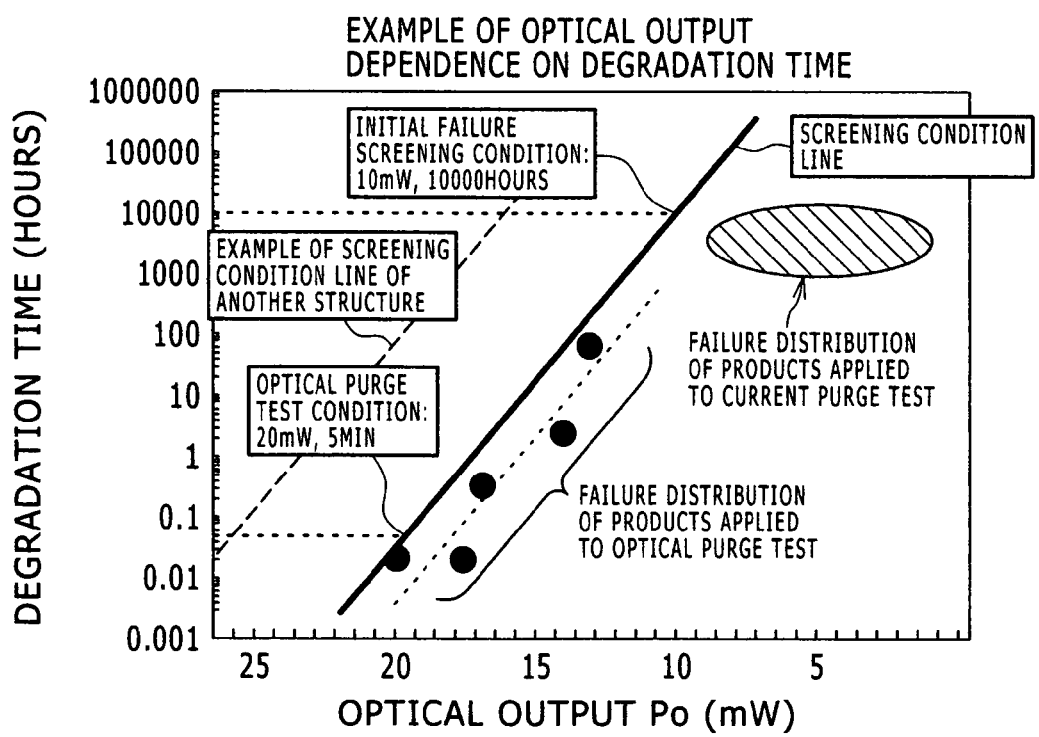
FIG. 4 is a view illustrating optical output dependence on optical degradation time.
Figure 5:
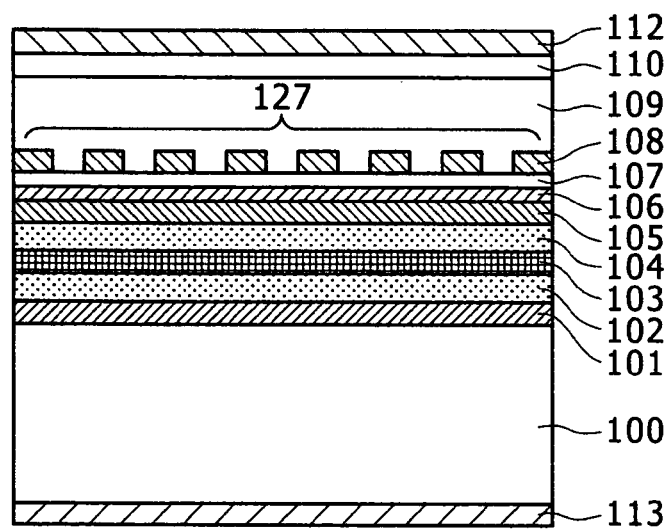
FIG. 5 is a cross-sectional view of a semiconductor laser in an optical axis direction.
Figure 6:
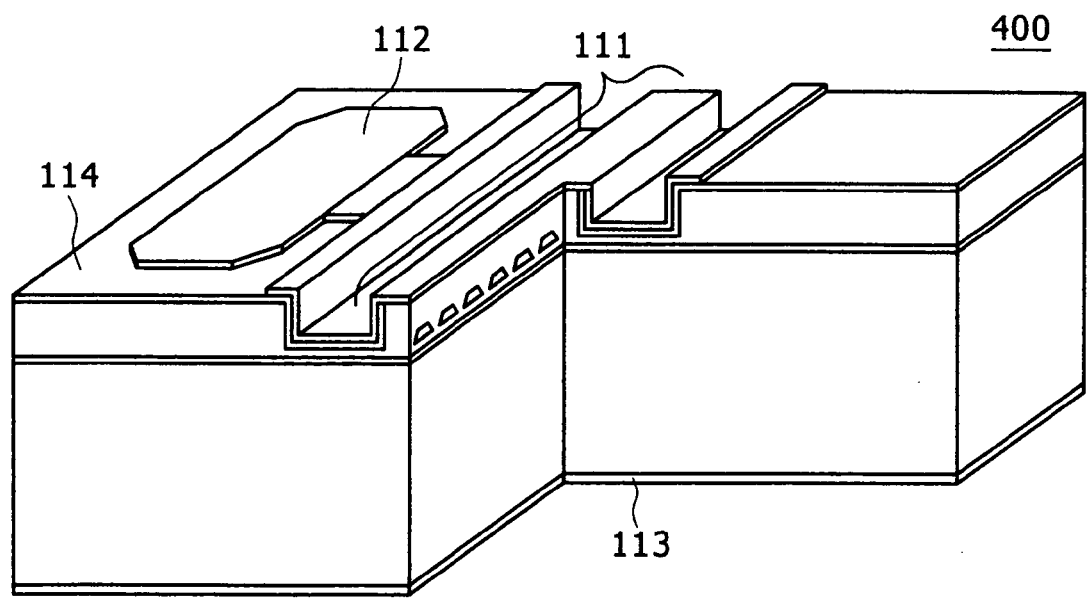
FIG. 6 is a perspective partial cross-sectional view of the semiconductor laser in an optical axis direction.
Figure 7A:
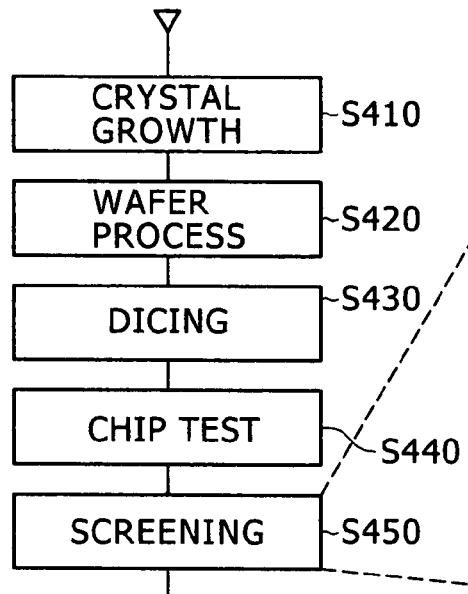
FIGS. 7A and 7B are views illustrating a screening step of a semiconductor laser diode.

A first embodiment will be described with reference to FIGS. 2 to 8. Here, FIG. 2 is a view illustrating an initial failure mode due to the amount of optical output. FIG. 3 is a view illustrating the relation between the input power and the optical output (I-L characteristic) with temperature as a parameter. FIG. 4 is a view illustrating optical output dependence on optical degradation time. FIG. 5 is a cross-sectional view of a semiconductor laser in an optical axis direction. FIG. 6 is a perspective partial cross-sectional view of the semiconductor laser in an optical axis direction. FIG. 7 includes views illustrating a screening step of a semiconductor laser diode. FIG. 8 is a functional block diagram of an optical transmission module.

In FIG. 2, in a semiconductor laser using InGaAlAs as an active layer material, the nonradiative recombination and energy bandwidth reduction, or the positive feedback phenomenon of optical absorption, occurs through the interband transition due to crystal defects in InGaAlAs. As a result, crystal destruction occurs in the active layer, and the initial failure is advanced as the amount of optical power therein (namely, the amount of optical output observed from the outside) increases, in almost independent of the temperature.

However, also in the semiconductor lasers using the active layer materials with many crystal defects such as InGaAlAs and GaInNAs, the screening has been performed only using a test of high temperature and large current (hereinafter referred to as a current purge test), similarly to the semiconductor lasers using the active layer material of InGaAsP and the like with less crystal defects.

In FIG. 3, the current purge test has been performed at 100° C. and 150 mA, so that the optical output itself has been small. Further, depending on circumstances, the screening test has often been performed under the condition that light is hardly emitted. In order to screen the initial failure due to the failure mode described above with reference to FIG. 2, it is necessary to perform a test at room temperature (25° C.) and large current (150 mA) (hereinafter referred to as an optical purge test).

In FIG. 4, the abscissa represents the optical output, and the ordinate represents the degradation time indicated by the logarithmic scale. The failure product distribution of the products applied to the current purge test, which is shown in FIG. 4, is a life test result of the working sample for semiconductor laser diode having been subjected to only the current purge test, in which the degradation time is about 20,000. In other words, since the current purge test itself has been performed at an optical output ranging from 1 mW or less to several mW, the semiconductor laser diode generates an initial failure without being screened. With respect to the working sample for semiconductor laser having been only subjected to the current purge test, the degradation time was evaluated with an optical output swing at 25° C. The results are represented by five points indicated by black circles in FIG. 4. The screening conditions were defined by the solid line with a margin relative to the regression line (the dotted line in the figure) obtained from the five points. In other words, it is possible to assure a life of 10 mW 100,000 hours, by adding an optical purge test at 25° C. with 20 mW for 5 minutes into the screening step.

Hereinafter a description will be made of a case in which the above described screening was applied to a ridge waveguide type DFB semiconductor laser diode for a wavelength of 1.3 µm band.

As shown in FIG. 5, a buffer layer 101 (n-type InP, 2E18 cm^-3, 0.4 µm), an optical guide layer 102 (n-type InGaAlAs layer, 2E18 cm^-3, 0.1 µm), a multiple quantum well active layer 103 (well/barrier of InGaAlAs: 6 cycles, thickness 0.18 µm), an optical guide layer 104 (p-type InGaAlAs, 4E17 cm^-3, 0.03 µm), an InAlAs clad layer 105 (p-type InAlAs, 8E17 cm^-3, 0.06 µm), an etch stopper layer 106 (p-type InGaAsAs, 8E17 cm^-3, 0.05 µm), a spacer layer 107 (p-type InP, 8E17 cm^-3, 0.02 µm), and a grating layer 108 (p-type InGaAsP, 8E17 cm^-3, 0.02 µm) were crystal grown sequentially on an n-type InP substrate 100 (n-type, 1E18 cm^-3), and thus a grating 127 was formed. On the grating 127, an InP clad layer 109 (p-type InP, 1E18 cm^-3, 1.3 µm) and a contact layer 110 (p-type InGaAs, 1E19 cm^-3, 0.2 µm) were crystal grown to form a ridge waveguide 114.

In FIG. 6, the width of the ridge waveguide of a ridge waveguide type DFB semiconductor laser diode 400 was set to a range of 1 to 2 µm. Then the element was manufactured through formation of a passivation layer 117 (SiO2 film, 0.4 µm), formation of a p electrode 112 (Ti/Pt/Au, thickness 0.7 µm), bottom grinding, formation of an n electrode 113 (AuGe/Ni/TiPt/Au, thickness 0.8 µm), and cleavage process. Incidentally, a non-reflective film was formed on a front end surface of the element, and a high reflective film was formed on a back end surface thereof. The length of a resonator was set to a range of 150 to 250 µm.

Figure 7B:
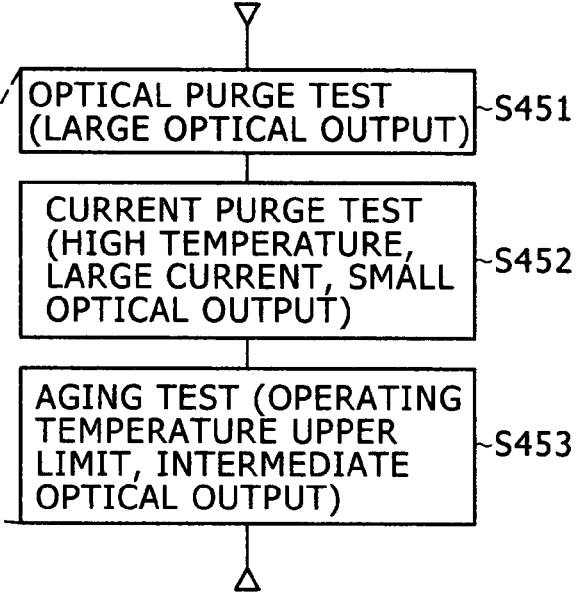
Figure 8:
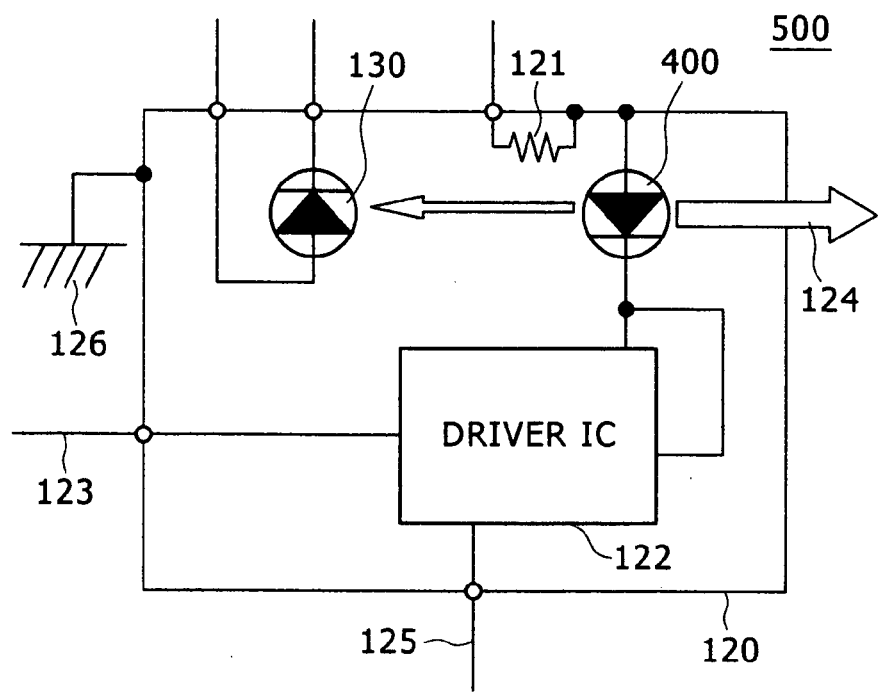
FIG. 8 is a functional block diagram of an optical transmission module.

A screening step shown in FIG. 7B was applied for eliminating the initial failure mode of the semiconductor laser diode 400 and of assuring the expected life needed for the communication laser.

In FIG. 7A, the manufacturing process of the semiconductor laser diode includes the following steps: crystal growth (S410), wafer process (S420), dicing (S430), chip test (S440), and screening (S450).

Particularly, in the screening step, an optical purge test (25° C., initial optical output 23 mW: constant operation current, 3 minutes) was performed (S451). Next a current purge test (100° C., current 100 mA: constant operating current, 20 hours) was performed (S452). With respect to the good elements in which no degradation was observed in the optical purge test and the current purge test, an aging test (85° C., initial operating current 80 mA: constant optical output, 100 hours) was further performed at the upper limit of the operating temperature (S453). As a result, no degradation was observed in any of the elements input to the test.

Subsequently, a life confirmation test (85° C., initial operating current 80 mA: constant optical output) was continued for 2,000 hours. The result confirmed that the variation amount of the operating current, which was standardized by an initial value, $(\Delta Iop(t)=(Iop(t)-Iop(0))/Iop(0))$, varies in proportion to ½ times the life confirmation test time, and that over one million hours could be expected for the life of the elements.

Incidentally, in the above described embodiment, the optical purge test was performed at constant operating current with the initial optical output of 23 mW, but it may be performed at constant optical output. Further, the optical output in the optical purge test may be not less than 15 mW, the value being equivalent to 50% of the saturation optical output, and more preferably not less than 20 mW.

Further, the same effect was obtained when ridge-waveguide semiconductor laser diodes for a wavelength of 1.55 μm band were manufactured, when Fabry-Perot type ridge waveguide semiconductor laser diodes were manufactured, when ridge waveguide semiconductor laser diodes were manufactured on p-type InP substrates, and when ridge waveguide semiconductor laser diodes using GaInNAs or AlGaAs as an active layer material were manufactured on GaAs substrates. In other words, the semiconductor lasers have the same effect when the materials, whose reliability is easily affected by crystal defects than the case of using InGaAsP as the active layer of the semiconductor laser, are applied as the active layers.

In FIG. 8, the semiconductor laser diode 400 is provided in a case 120 placed in an optical transmission module 500, and is directly modulated and driven by a driver IC 122. The front optical signal of the semiconductor laser diode 400 is transmitted by an optical fiber not shown. The back light of the semiconductor laser diode 400 is monitored by a monitor photodiode 130. A thermistor is provided in the vicinity of the semiconductor laser diode 400 in the case 120 to monitor the temperature of the semiconductor laser diode 400. The back optical power and the temperature are used for a drive control of the semiconductor laser diode 400. The semiconductor laser diode 400 mounted on the optical transmission module 500 has been subjected to the optical purge test, so that there is no initial failure mode caused by the laser diode of the optical transmission module, thus making it possible to supply the module that is very stable in reliability and mass production into the market.

Embodiment 2

Figure 9:
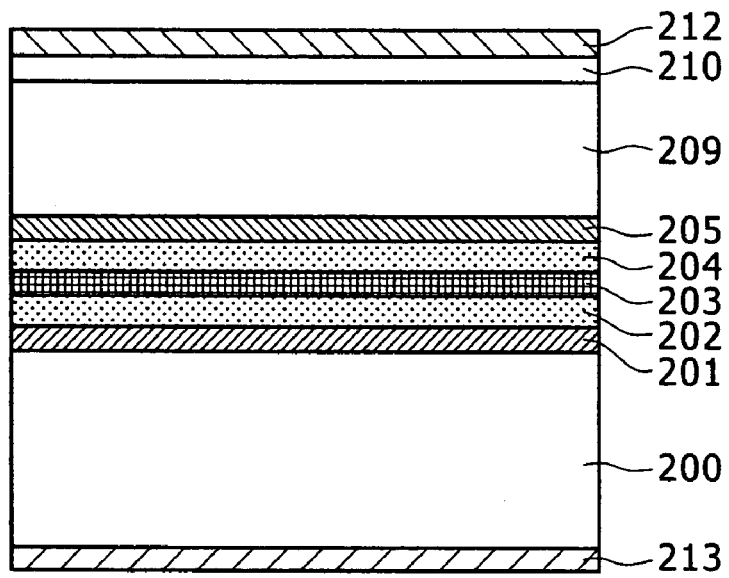
FIG. 9 is a cross-sectional view of a semiconductor laser in an optical axis direction.
Figure 10:
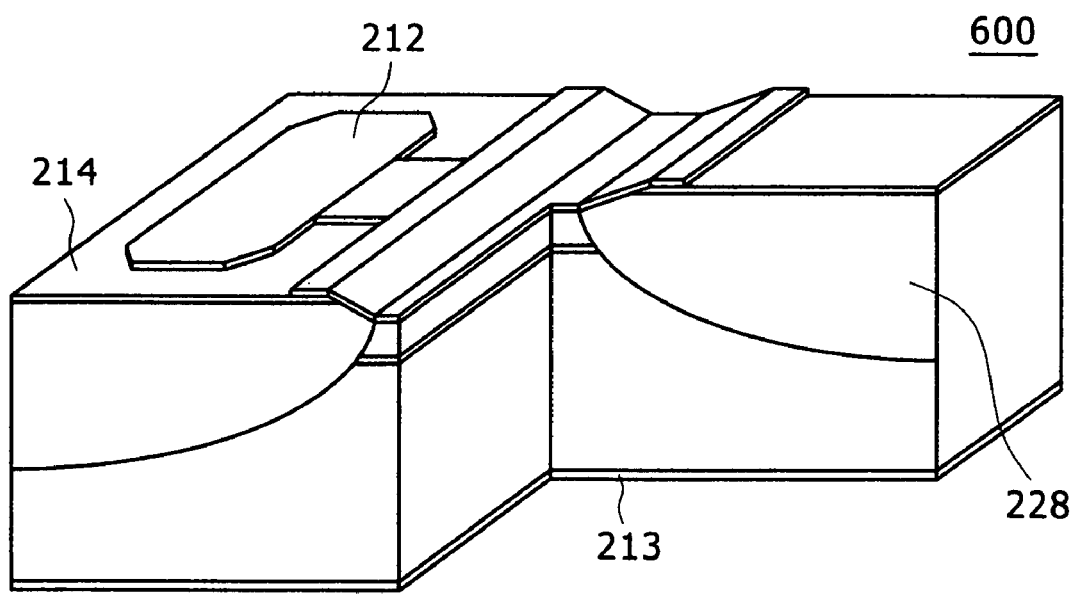
FIG. 10 is a perspective partial cross-sectional view of the semiconductor laser in an optical axis direction.

Referring to FIGS. 9, 10 and FIG. 7, a description will be made of a case in which the above described screening step was applied to the manufacturing process of a buried-heterostructure Fabry-Perot semiconductor laser diode for a wavelength of 1.3 μm band. Here, FIG. 9 is a cross-sectional view of a semiconductor laser in an optical axis direction. FIG. 10 is a perspective partial cross-sectional view of the semiconductor laser in an optical axis direction.

In FIG. 9, a buffer layer 201 (n-type InP, $1.5E18$ cm^-3, 0.5 μm), an optical guide layer 202 (n-type InGaAlAs layer, $2E18$ cm^-3, 0.1 μm), a multiple quantum well active layer 203 (well/barrier of InGaAlAs: 7 cycles, thickness 0.21 μm), an optical guide layer 204 (p-type InGaAlAs, $3E17$ cm^-3, 0.1 μm)), an InAlAs clad layer 205 (p-type InAlAs, $8E17$ cm^-3, 0.1 μm), an InP clad layer 209 (p-type InP, $1E18$ cm^-3, 1.4 μm), and a contact layer 210 (p-type InGaAs, $1E19$ cm^-3, 0.15 μm) were crystal grown sequentially on an InP substrate 200 (n-type, $1.5E18$ cm^-3), in which a waveguide is formed by etching through the multiple quantum well active layer. The width of the waveguide was set to a range of 1.2 to 2.3 μm. Then, a buried-heterostructure laser diode was manufactured through formation of an Fe—InP regrowth layer 215 with high resistance, formation of a passivation film 217 (SiO2 film, 0.4 μm), formation of a p electrode 212 (Ti/Pt/Au, thickness 0.7 μm), bottom grinding, formation of an n electrode 213 (AuGe/Ni/TiPt/Au, thickness 0.8 μm), and cleavage process.

In FIG. 10, a non-reflective film was formed on a front end surface of the buried-heterostructure laser diode 600, and a high reflective film was formed on a back end surface thereof. The length of a resonator of the buried-heterostructure laser diode 600 was set to a range of 50 to 250 μm.

The screening step shown in FIG. 7B was applied for eliminating the initial failure mode of the semiconductor laser diode and of assuring the expected life needed for the communication laser. First, an optical purge test (50° C., initial optical output 28 mW: constant operating current, 5 minutes) was performed (S451). Next, a current purge test (110° C., current 100 mA: constant operating current, 20 hours) was performed (S452). With respect to the good elements in which no degradation was observed in the two purge tests, an aging test (85° C., initial operating current 80 mA: constant optical output, 100 hours) was further performed (S453). As a result, no degradation was observed in any of the elements input to the test. Subsequently, a life confirmation test (85° C., initial operating current 80 mA: constant optical output) was continued for 2000 hours. The result confirmed that the variation amount of the operating current, which was standardized by an initial value, varies in proportion to ½ times the life confirmation test time, and that over one million-hours could be expected for the life of the elements.

Further, the same effect was obtained when buried-heterostructure semiconductor laser diodes for a wavelength of 1.55 μm band were manufactured, when buried-heterostructure DFB semiconductor laser diodes were manufactured, when buried-heterostructure semiconductor laser diodes were manufactured on p-type InP substrates, and when buried-heterostructure semiconductor laser diodes using GaInNAs or AlGaAs as an active layer material were manufactured on GaAs substrates.

Embodiment 3

Figure 11:
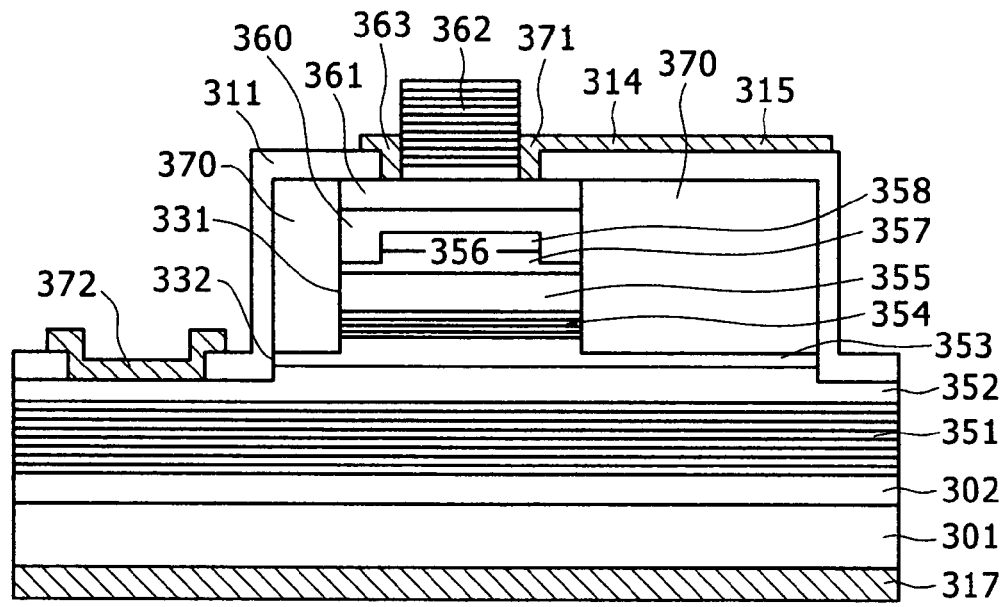
FIG. 11 is a cross-sectional view of a surface emitting semiconductor laser.
Figure 12:
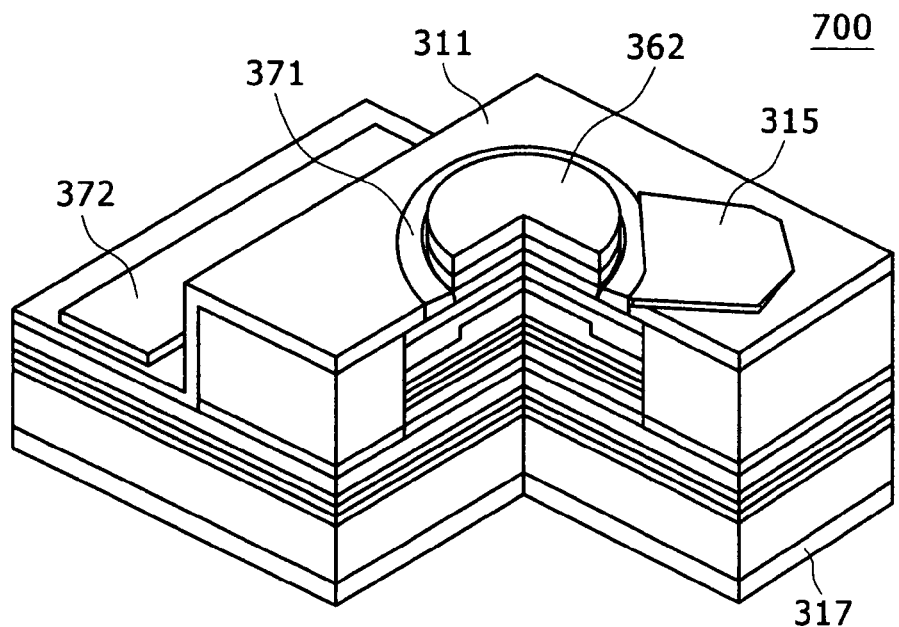
FIG. 12 is a perspective partial cross-sectional view of the surface emitting semiconductor laser in an optical axis direction.

Referring to FIGS. 11, 12 and FIG. 7, a description will be made of the manufacturing process of a surface emitting semiconductor laser diode for a wavelength of 1.3 m band. FIG. 11 is a cross-sectional view of a surface emitting semiconductor laser. FIG. 12 is a perspective partial cross-sectional view of the surface emitting semiconductor laser in an optical axis direction.

As shown in FIG. 11, a buffer layer 302 (n-type InP layer, $1E18$ cm^-3, 0.2 μm), a semiconductor reflection mirror 303 (n-type InAlAs/InGaAlAs layer, $1E18$ cm^-3, 42-cycle structure of λ/4 film thickness each), a lower contact layer 352 (n-type InP layer, $5E17$ cm^-3, 0.2 μm), a clad layer 353 (n-type InAlAs layer, $5E17$ cm^-3, 0.2 μm), an MQW layer 354 (well/barrier of InGaAlAs: 7 cycles, thickness 0.2 μm), a clad layer 355 (p-type InAlAs layer, $5E17$ cm^-3, 0.7 μm), and a tunnel junction layer 356 (p+-InGaAlAs/n+InGaAs layer, $3E19$ cm^-3, 20 nm/12 nm) were crystal grown sequentially on an InP substrate 301 (n-type, $1.5E18$ cm^-3). In order to form a current confinement region, of the tunnel junction layer 356 except the current confinement region, a portion of a p+InGaAlAs layer 357 and the whole of n+InGaAs layer 358 were removed by dry etching on which an n-InP regrowth layer 360 (n-type, thickness 0.1 μm) and an upper contact layer 361 (n-type InGaAs layer, $2E19$ cm^-3, 0.1 μm) were grown.

Incidentally, in order to avoid tunnel junction formation in the n-InP layer 360 except the current confinement region, the impurity concentration was reduced to $5E17$ cm^-3 from the start of growth to when the thickness was 10 nm, and subsequently the impurity concentration was set to $5E18$ cm^-3 until the thickness was 0.1 μm. Further, in order to avoid absorption losses, portions of the upper contact layer 361 (InGaAs layer), which correspond to the portion directly on the current confinement region and to the surrounding area, were selectively etched and removed by wet etching, on which a dielectric multilayer film mirror 362 (AlxOy/a-Si, 4-cycle structure of λ/4 film thickness each) was formed. The outside of a ring electrode 363 was designed to have a two-step mesa structure in order to reduce leakage current and capacity. A first mesa 331 was formed by etching from the InGaAs upper contact layer 361 to the clad layer 353. The surrounding of the first mesa 331 was embedded by a high-resistance InP regrowth layer 370 (thickness 0.6 μm). Then a second mesa 332 was formed by further etching the outside of the high-resistance InP regrowth layer 370 to the InP lower contact layer 352.

Here, on the semiconductor layer, except the area in which the dielectric multilayer mirror 362 was formed and except the area in which the electrode contacted the semiconductor, an SiN film (0.25 μm) was formed as a protective film 311. An upper ohmic electrode 371 (AuGe/Ni/TiPt/Au, thickness 0.7 μm) was brought into contact with the semiconductor in the upper contact layer 361 and the ring electrode 363. A wiring 314 (width 5 μm, length 100 μm) and an electrode pad 315 (75 μmϕ) were provided on the SiN film 311 and the InP regrowth layer 370. In this way the configuration was designed to reduce the parasitic capacitance and to prevent the occurrence of the breaking of the wiring. Further, a lower ohmic electrode 372 (AuGe/Ni/Ti/Pt/Au, thickness 0.7 μm) was formed on the top simultaneously with the formation of the upper ohmic electrode 371. The bottom of the InP substrate 301 in which no active region of the element was provided was ground to a thickness of 100 μm, and then a bottom metal film 317 for die bonding (AuGe/Ni/Ti/Pt/Au, thickness 0.8 μm) was provided on the bottom. Thus a surface emitting semiconductor laser diode 700 shown in FIG. 12 was formed.

The screening step shown in FIG. 7B was applied for eliminating the initial failure mode of the above described surface emitting semiconductor laser diode, and assuring the expected life needed for the communication laser. First, an optical purge test (10° C., initial optical output 2 mW: constant operating current, 10 minutes) was performed (S451). Next, a current purge test (100° C., current 10 mA: constant operating current, 20 hours) was further performed (S452). With respect to the good elements in which no degradation was observed in the two purge tests, an aging test (85° C., initial operating current 4 mA: constant optical output, 100 hours) was performed (S453). As a result, no degradation was observed in any of the elements input to the test.

Incidentally, in the case of the surface emitting laser diode, the optical output is about one tenth and the drive current is also about one tenth, as compared to the case of the side emitting laser diode. However, the initial optical output (2 mW) of the optical purge test of the surface emitting laser diode is 50% or more of the saturation optical output value, which is equivalent to the case of the side emitting laser diode.

Subsequently a life confirmation test was continued for 2000 hours. The result confirmed that the variation amount of the operating current, which was standardized by an initial value, varied in proportion to ½ times the life confirmation test time, and that over one million hours could be expected for the life of the elements.

Further, the same effect was obtained when surface emitting semiconductor laser diodes for a wavelength of 1.55 μm band were manufactured, when surface emitting lasers with a structure without using the tunnel junction were manufactured, when surface emitting semiconductor laser diodes were manufactured on p-type InP substrates, and when surface emitting semiconductor laser diodes using GaInNAs or AlGaAs as an active layer material were manufactured on GaAs substrates.

The present invention has made it possible to establish the screening conditions of a communication laser using a material with relatively many crystal defects for the active material. It has also made it possible to provide a communication laser with high reliability.

We claim:

1. A method of manufacturing a semiconductor laser for communication including a screening step of constant operating current with an optical output of not less than 15 mW at the initial optical output, or of constant optical output with an optical output of not less than 15 mW.

2. The method of manufacturing a semiconductor laser for communication according to claim 1, characterized in that said method includes a screening step of constant operating current with an optical output of not less than 20 mW at the initial optical output, or of constant optical output with an optical output of not less than 20 mW.

3. The method of manufacturing a semiconductor laser for communication according to claim 2, characterized in that a material whose reliability is more easily affected by crystal defects than the case of using InGaAsP, is applied as an active layer of the semiconductor laser.

4. The method of manufacturing a semiconductor laser for communication according to claim 1, characterized in that a material whose reliability is more easily affected by crystal defects than the case of using InGaAsP, is applied as an active layer of the semiconductor laser.

5. A method of manufacturing a semiconductor laser for communication including a screening step of constant operating current with an optical output of not less than 50% of the saturation optical output at the initial optical output, or of constant optical output with an optical output of not less than 50% of the saturation optical output.

6. The method of manufacturing a semiconductor laser for communication according to claim 5, characterized in that said semiconductor laser for communication is a surface emitting laser.

7. The method of manufacturing a semiconductor laser for communication according to claim 6, characterized in that a material whose reliability is more easily affected by crystal defects than the case of using InGaAsP, is applied as an active layer of the semiconductor laser.

8. The method of manufacturing a semiconductor laser for communication according to claim 5, characterized in that a material whose reliability is more easily affected by crystal defects than the case of using InGaAsP, is applied as an active layer of the semiconductor laser.

* * * * *